(12) United States Patent
Matsumoto et al.

(10) Patent No.: US 8,865,590 B2
(45) Date of Patent: Oct. 21, 2014

(54) FILM FORMING METHOD, PRETREATMENT DEVICE, AND PROCESSING SYSTEM

(75) Inventors: Kenji Matsumoto, Nirasaki (JP); Hitoshi Itoh, Nirasaki (JP); Hidenori Miyoshi, Nirasaki (JP); Shigetoshi Hosaka, Nirasaki (JP); Hiroshi Sato, Nirasaki (JP); Koji Neishi, Sendai (JP); Junichi Koike, Sendai (JP)

(73) Assignees: Tokyo Electron Limited, Tokyo (JP); National University Corporation Tohoku University, Sendai-shi (JP)

( * ) Notice: Subject to any disclaimer, the term of this patent is extended or adjusted under 35 U.S.C. 154(b) by 284 days.

(21) Appl. No.: 13/378,535

(22) PCT Filed: Jun. 16, 2010

(86) PCT No.: PCT/JP2010/060191
§ 371 (c)(1),
(2), (4) Date: Feb. 8, 2012

(87) PCT Pub. No.: WO2010/147141
PCT Pub. Date: Dec. 23, 2010

(65) Prior Publication Data
US 2012/0135612 A1 May 31, 2012

(30) Foreign Application Priority Data

Jun. 16, 2009 (JP) .................................. 2009-142963

(51) Int. Cl.
| | |
|---|---|
| H01L 21/00 | (2006.01) |
| H01L 21/768 | (2006.01) |
| H01L 21/3205 | (2006.01) |
| H01L 21/285 | (2006.01) |
| H01L 21/3105 | (2006.01) |
| C23C 16/40 | (2006.01) |
| C23C 16/02 | (2006.01) |

(52) U.S. Cl.
CPC .... *H01L 21/76814* (2013.01); *H01L 21/76867* (2013.01); *H01L 21/32051* (2013.01); *H01L 21/76844* (2013.01); *H01L 21/76831* (2013.01); *H01L 21/28556* (2013.01); *H01L 21/3105* (2013.01); *C23C 16/40* (2013.01); *C23C 16/02* (2013.01)
USPC .......................................... 438/638; 438/778

(58) Field of Classification Search
USPC .............. 118/723 E, 719; 438/637–640, 778
See application file for complete search history.

(56) References Cited

U.S. PATENT DOCUMENTS 5,855,681 A * 1/1999 Maydan et al. ............... 118/719
5,900,103 A * 5/1999 Tomoyasu et al. ........ 156/345.44
(Continued)

FOREIGN PATENT DOCUMENTS

| JP | 11 297829 | 10/1999 |
|---|---|---|
| JP | 2002 26121 | 1/2002 |

(Continued)

OTHER PUBLICATIONS

International Search Report Issued Aug. 24, 2010 in PCT/JP10/060191 Filed Jun. 16, 2010.

*Primary Examiner* — Richard Booth
(74) *Attorney, Agent, or Firm* — Oblon, Spivak, McClelland, Maier & Neustadt, L.L.P.

(57) ABSTRACT

A film forming method is disclosed in which a thin film comprising manganese is formed on an object to be processed which has, on a surface thereof, an insulating layer constituted of a low-k film and having a recess. The method comprises a hydrophilization step in which the surface of the insulating layer is hydrophilized to make the surface hydrophilic and a thin-film formation step in which a thin film containing manganese is formed on the surface of the hydrophilized insulating layer by performing a film forming process using a manganese-containing material gas on the surface of the hydrophilized insulating layer. Thus, a thin film comprising manganese, e.g., an MnOx film, is effectively formed on the surface of the insulating layer constituted of a low-k film, which has a low dielectric constant.

14 Claims, 11 Drawing Sheets

(56) References Cited

U.S. PATENT DOCUMENTS

| | | | |
|---|---|---|---|
| 5,916,455 A * | 6/1999 | Kumagai | 216/68 |
| 6,800,546 B2 | 10/2004 | Konishi et al. | |
| 7,304,384 B2 | 12/2007 | Koike et al. | |
| 2003/0155657 A1 | 8/2003 | Tonegawa et al. | |
| 2005/0026454 A1 | 2/2005 | Konishi et al. | |
| 2005/0121787 A1 | 6/2005 | Uchida | |
| 2005/0272237 A1 | 12/2005 | Hautala et al. | |
| 2005/0272265 A1 | 12/2005 | Geffken et al. | |
| 2006/0037858 A1 | 2/2006 | Marumo et al. | |
| 2007/0026642 A1 | 2/2007 | Hishiya | |
| 2009/0130861 A1 | 5/2009 | Hautala et al. | |
| 2010/0140802 A1 | 6/2010 | Matsumoto et al. | |
| 2010/0233876 A1 * | 9/2010 | Matsumoto et al. | 438/652 |

FOREIGN PATENT DOCUMENTS

| | | |
|---|---|---|
| JP | 2002 118112 | 4/2002 |
| JP | 2002 370059 | 12/2002 |
| JP | 2003 309170 | 10/2003 |
| JP | 2003 338540 | 11/2003 |
| JP | 2004 107747 | 4/2004 |
| JP | 2004 343087 | 12/2004 |
| JP | 2005 167081 | 6/2005 |
| JP | 2005 277390 | 10/2005 |
| JP | 2007 273848 | 10/2007 |
| JP | 2008 13848 | 1/2008 |
| JP | 2008 502150 | 1/2008 |
| JP | 2008 300568 | 12/2008 |
| JP | 2009 16782 | 1/2009 |

* cited by examiner

|  | $H_2O$ | $C_2H_5OH$ |
|---|---|---|
| TEOS($SiO_2$) | O | O |
| SIOC | X | O |

X : NO WETTABILITY
O : WETTABILITY

| $O_2$ PLASMA PROCESSING TIME | | | | | (SiOC/$H_2O$) |
|---|---|---|---|---|---|
| 0 sec | 5 sec | 10 sec | 15 sec | 30 sec | |
| X | O | O | O | O | |

FILM FORMING METHOD, PRETREATMENT DEVICE, AND PROCESSING SYSTEM

FIELD OF THE INVENTION

The present invention relates to a technique for forming a thin film containing manganese (Mn) in an insulating film constituted of a low-k film and having a recess which is formed on a surface of an object to be processed such as a semiconductor wafer or the like.

BACKGROUND OF THE INVENTION

Generally, when a semiconductor device is manufactured, various processes such as a film forming process, a pattern etching process and the like are repeatedly performed on a semiconductor wafer to manufacture a desired device. With a demand for high integration and high miniaturization of semiconductor devices, a line width and a hole diameter are getting smaller. Further, as for a wiring material or a filling material for filling a recess such as a trench, a hole or the like, there has been a tendency of using copper (Cu) which has a significantly low electric resistance and is inexpensive to satisfy the need to reduce electrical resistance due to the miniaturization of various dimensions (Japanese Patent Application Publication No. 2004-107747). When copper is used as the wiring material or the filling material, a tantalum (Ta) metal film, a tantalum nitride (TaN) film or the like is generally used as a barrier layer in consideration of a diffusion barrier property for copper to the underlying layers.

In order to fill the recess with copper, a thin seeding film formed of a copper film is firstly formed on the entire wafer surface including the entire inner surface of the recess by using a plasma sputtering apparatus. Then, a copper plating process is performed on the entire wafer surface, so that the inside of the recess is completely filled. Thereafter, the excessive copper thin film on the wafer surface is removed by a polishing process such as a CMP (chemical mechanical polishing) process or the like.

This will be described with reference to FIGS. 13A to 13C. FIGS. 13A to 13C show a conventional process for filling a recess of a semiconductor wafer. A recess 2, e.g., a via hole, a through hole or a groove (a trench), having a single damascene structure, a dual damascene structure or a three-dimensional mounting structure is formed on a surface of an insulating layer 1, e.g., an interlayer insulation film constituted of a $SiO_2$ film, formed on the semiconductor wafer W. At the bottom of the recess 2, an underlying wiring layer 3 made of, e.g., copper, is formed to be exposed.

Specifically, the recess 2 includes a thin and long groove (trench) 2A and a hole 2B formed at a part of the bottom portion of the groove 2A and serving as a via hole or a through hole. Further, the wiring layer 3 is exposed on the bottom portion of the hole 2B to make electric connection to an underlying wiring layer or a device such as a transistor or the like. The illustration of the underlying wiring layer or the device such as a transistor or the like is omitted. Due to the miniaturization of design rules, the recess 2 has a very small width or inner diameter of, e.g., about 120 nm, and an aspect ratio of, e.g., about 2 to 4. The illustration of a diffusion barrier film, an etching stop film or the like is simplified or omitted.

A barrier layer 4 having, e.g., a laminated structure of a TaN film and a Ta film, has been substantially uniformly formed beforehand on the surface of the semiconductor wafer W including the inner surface of the recess 2 by using a plasma sputtering apparatus (see FIG. 13A). Then, a seeding film 6 formed of a thin copper film as a metal film is formed on the entire surface of the wafer including the inner surface of the recess 2 by using the plasma sputtering apparatus (see FIG. 13B). Thereafter, a copper plating process is performed on the wafer surface, so that the recess 2 is filled with a metal film 8 formed of, e.g., a copper film (see FIG. 13C). Next, the excessive metal film 8, the excessive seeding film 6 and the excessive barrier layer 4 on the wafer surface are removed by a polishing process such as the CMP process or the like.

Various developments have been made in order to further improve the reliability of the barrier layer. Among them, a self-forming barrier layer using a Mn film or a CuMn alloy film instead of the Ta film and the TaN film attracts attention (Japanese Patent Application Publication No. 2005-277390). The Mn film or the CuMn alloy film is formed by sputtering. Further, the Mn film or the CuMn alloy film itself serves as a seeding film, so that a Cu plating layer can be formed directly thereon. Since an annealing process is performed after the plating process is completed, the film reacts with a $SiO_2$ layer as a lower insulation film in a self-aligned manner. Thus, a barrier film such as a $MnSixOy$ (x and y being any integers) film or manganese oxide $MnOx$ (x being any integers) obtained by reaction between Mn and oxygen in the $SiO_2$ layer is formed at a boundary portion between the $SiO_2$ layer and the Mn film or the CuMn alloy film. Accordingly, the number of production processes can be reduced. The manganese oxide includes $MnO$, $Mn_3O_4$, $Mn_2O_3$, $MnO_2$ and the like depending on the valency of the Mn. They are generally referred to as "MnOx" in this specification. Moreover, there is studied a technique for forming a $MnSixOy$ film or a $MnOx$ film by a CVD method capable of depositing a film with a good step coverage for a fine line width or hole diameter compared to a sputtering method (Japanese Patent Application Publication No. 2008-013848).

Meanwhile, along with a recent demand for high-speed operations of semiconductor devices, a relative dielectric constant of the interlayer insulation film needs to be further decreased. Due to this demand, it is suggested to use, as a material of the interlayer insulation film, a silicon oxide film made of TEOS or a low-k film made of a material having a lower relative dielectric constant such as SiOC, SiCOH or the like containing an organic group, e.g., a methyl group. Here, the relative dielectric constant of the silicon oxide film made of TEOS is about 4.1, and the relative dielectric constant of SiOC is about 3.0. However, when the low-k film is used as the interlayer insulation film, a MnOx film is hardly deposited even though a Mn-containing film forming process is performed by a CVD method on the surface of the interlayer insulation film having a low relative dielectric constant which includes the exposed surface in the recess. As a result, a barrier layer cannot be formed.

SUMMARY OF THE INVENTION

In view of the above, the present invention provides a film forming method capable of forming a thin film containing manganese, e.g., a MnOx film, on a surface of an insulating layer constituted of a low-k film, a pretreatment device, and a processing system.

The present inventors have studied a method for depositing MnOx on a surface of an insulating layer constituted of a low-k film. As a consequence, the present inventor have conceived the present invention by discovering that a thin film of MnOx can be effectively deposited by improving the wettability of the insulating layer by performing a hydrophilization process, e.g., exposing the surface of the insulating layer to a plasma, before the formation of the MnOx film.

In accordance with a first aspect of the invention, there is provided a film forming method for forming a thin film containing manganese on an object to be processed which has, a surface thereof, an insulating layer constituted of a low-k film and having a recess, the film forming method including: a hydrophilization step in which the surface of the insulating layer is hydrophilized to make the surface hydrophilic; and a thin-film formation step in which a thin film containing manganese is formed on the surface of the hydrophilized insulating layer by performing a film forming process using a manganese-containing material gas on the surface of the hydrophilized insulating layer.

With such configuration, it is effectively form a thin film containing a Mn, e.g., MnOx film by hydrophilizing a surface of an low-k film before foming the thin film containing Mn.

In the hydrophilization step, a plasma process may be performed on the insulating layer. The plasma process may be performed by using an oxygen-containing gas and/or a rare gas.

In the hydrophilization step, a UV ray ozone process for modifying the surface of the insulating layer by using UV rays and oxygen-containing gas may be performed.

In the hydrophilization step, a GCIB process for irradiating gas cluster ion beam on the surface of the insulating layer may be performed.

In the hydrophilization step, a visible ray irradiation process for irradiating visible rays having a wavelength of about 425 nm on the surface of the insulating layer may be performed.

Prior to the thin film formation step, an annealing step for removing moisture from the insulating layer by annealing the insulating layer at a temperature higher than a processing temperature of the thin film formation step may be performed.

Prior to the thin film formation step, an adsorption step for adsorbing water and/or oxygen-containing gas on the surface of the insulating layer may be performed.

The low-k film may have a relative dielectric constant smaller than 4.1. The low-k film may include at least one film selected from the group consisting of a SiOC film, a SiO film, a SiOF film, a SiC film, a SiCOH film, a SiCN film, a porous silica film, a porous methylsilsesquioxane film, a polyarylene film, a SiLK (Registered Trademark), and a fluorocarbon film.

The Mn-containing material may include at least one material selected from the group consisting of $Cp_2Mn[=Mn(C_5H_5)_2]$, $(MeCp)_2Mn[=Mn(CH_3C_5H_4)_2]$, $(EtCp)_2Mn[=Mn(C_2H_5C_5H_4)_2]$, $(i-PrCp)_2Mn[=Mn(C_3H_7C_5H_4)_2]$, $MeCpMn(CO)_3[=(CH_3C_5H_4)Mn(CO)_3]$, $(t-BuCp)_2Mn[=Mn(C_4H_9C_5H_4)_2]$, $CH_3Mn(CO)_5$, $Mn(DPM)_3[=Mn(C_{11}H_{19}O_2)_3]$, $Mn(DMPD)(EtCp)[=Mn(C_7H_{11}C_2H_5C_5H_4)]$, $Mn(acac)_2[=Mn(C_5H_7O_2)_2]$, $Mn(DPM)_2[=Mn(C_{11}H_{19}O_2)_2]$, $Mn(acac)_3[=Mn(C_5H_7O_2)_3]$, $Mn(hfac)_2[=Mn(C_5HF_6O_2)_3]$, $((CH_3)_5Cp)_2Mn[=Mn((CH_3)_5C_5H_4)_2]$, $[Mn(iPr-AMD)_2][=Mn(C_3H_7NC(CH_3)NC_3H_7)_2]$, and $[Mn(t\ Bu-AMD)_2][=Mn(C_4H_9NC(CH_3)NC_4H_9)_2]$.

In accordance with a second aspect of the invention, there is provided a pretreatment device for performing pretreatment before formation of a thin film containing Mn on an object to be processed which has, on a surface thereof, an insulating layer constituted of a low-k film and having a recess, the pretreatment device including: an evacuable processing chamber; a mounting table structure, provided in the processing chamber, for mounting thereon the object to be processed; a heating unit for heating the object to be processed; a gas introduction unit for introducing a gas into the processing chamber; a gas supply unit for supplying a rare gas, steam and an oxygen-containing gas to the gas introduction unit; a hydrophilization unit for hydrophilizing a surface of the insulating layer; and an apparatus control unit for performing an annealing process and an adsorption process on the object to be processed by controlling the entire apparatus. The hydrophilization unit may be selected among a plasma generation unit, a UV ray irradiation processing unit, a GCIB irradiation processing unit, a visible ray irradiation processing unit for irradiating visible rays having a wavelength of about 425 nm.

In accordance with a third aspect of the invention, there is provided a processing system for forming a thin film containing Mn on an object to be processed which has, on a surface thereof, an insulating layer constituted of a low-k film and having a recess, the processing system including: a common transfer chamber having therein a transfer mechanism for transferring the object to be processed; a hydrophilization apparatus, connected to the common transfer chamber, for hydrophilizing the object to be processed; a film forming apparatus, connected to the common transfer chamber, for forming a thin film containing Mn on the object to be processed; a system control unit for controlling an entire operation of the processing system. The hydrophilization apparatus may be selected among a plasma processing apparatus, a UV ray irradiation processing apparatus, a gas cluster ion beam irradiation processing apparatus, and a visible ray irradiation processing apparatus for irradiating visible rays having a wavelength of about 425 nm.

The common transfer chamber may be connected to an annealing apparatus for annealing the object to be processed. The common transfer chamber may be connected to an adsorption apparatus for adsorbing water and/or oxygen-containing gas on the object to be processed.

DETAILED DESCRIPTION OF THE EMBODIMENTS

Figure 1:
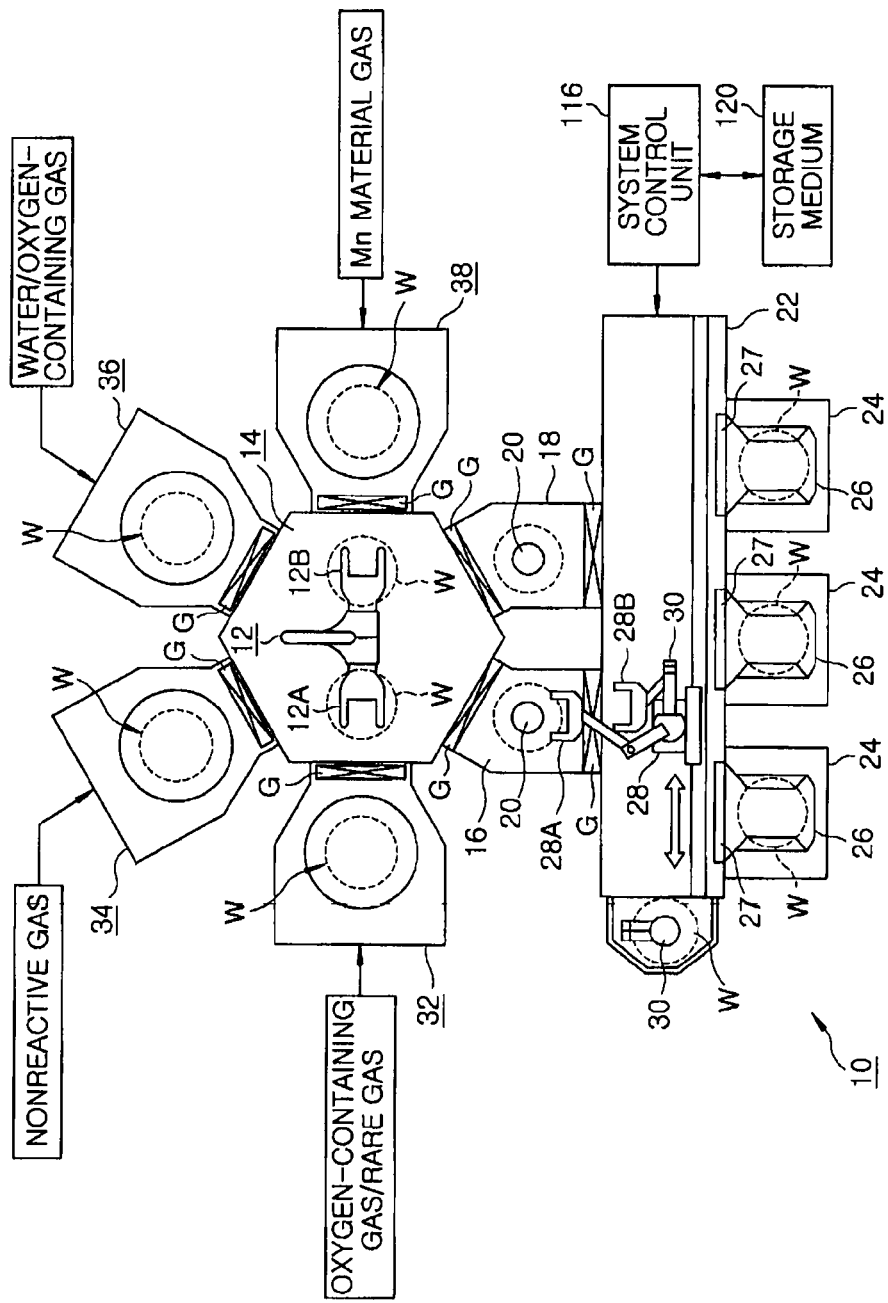
FIG. 1 is a schematic configuration view showing an example of a processing system for performing a method of the present invention.
Figure 2:
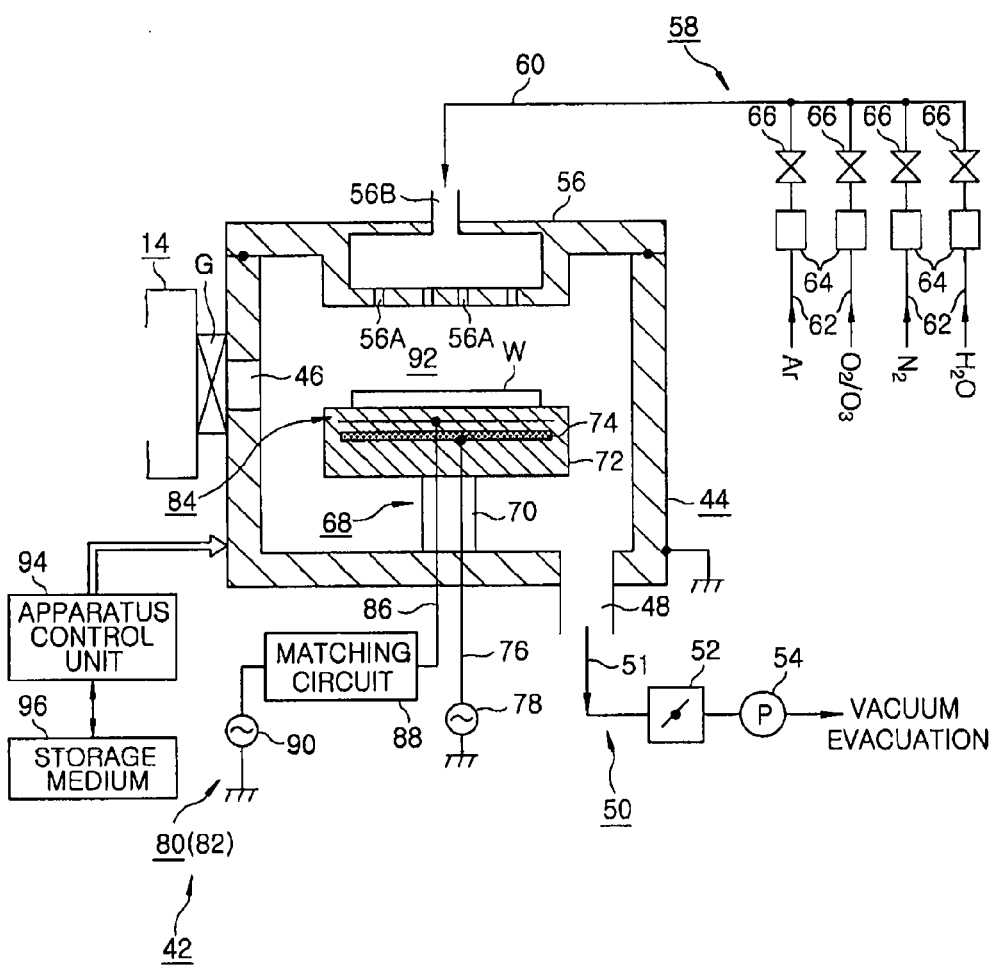
FIG. 2 is a schematic cross sectional view showing a pretreatment device capable of performing three processes including a hydrophilic process, an annealing process and an adsorption process.
Figure 3:
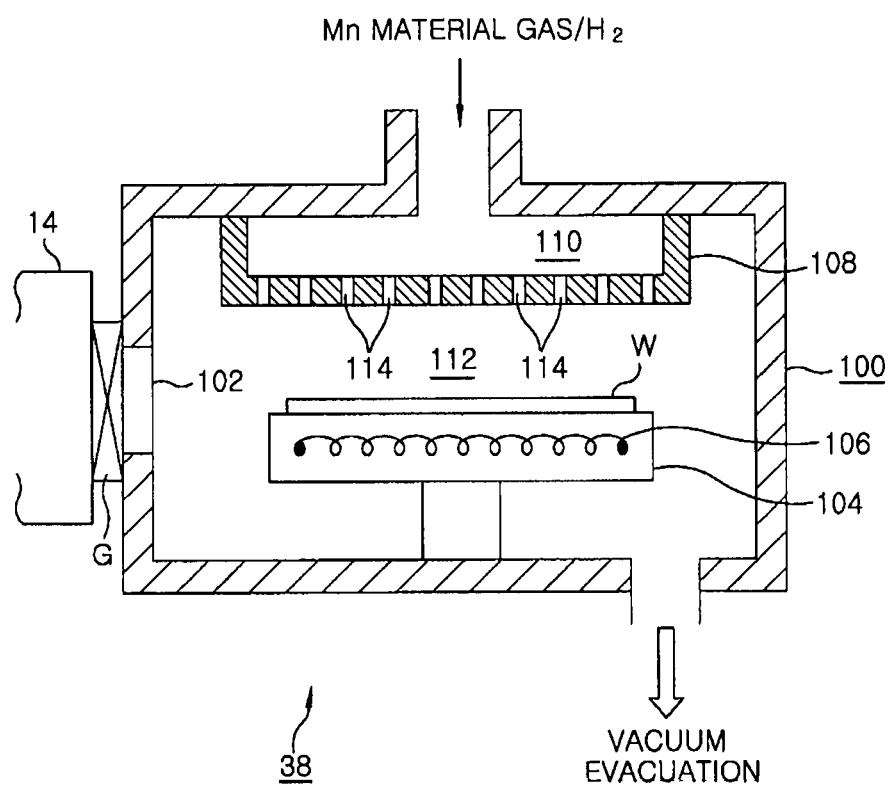
FIG. 3 is a schematic cross sectional view showing a film forming apparatus for forming manganese oxide.
Figure 5:
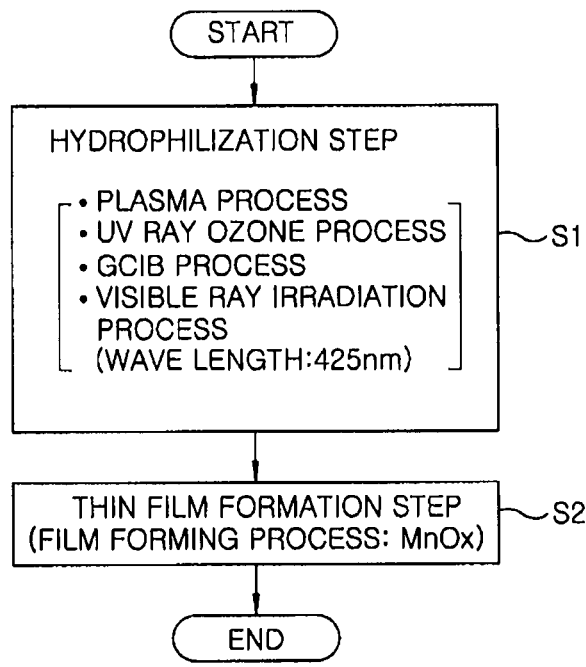
FIG. 5 is a flowchart showing a first test example of the film forming method of the present invention.
Figure 6:
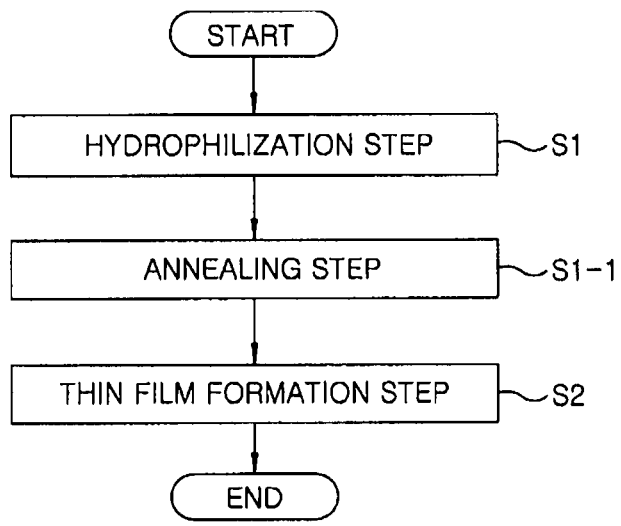
FIG. 6 is a flowchart showing a second test example of the film forming method of the present invention.
Figure 7:
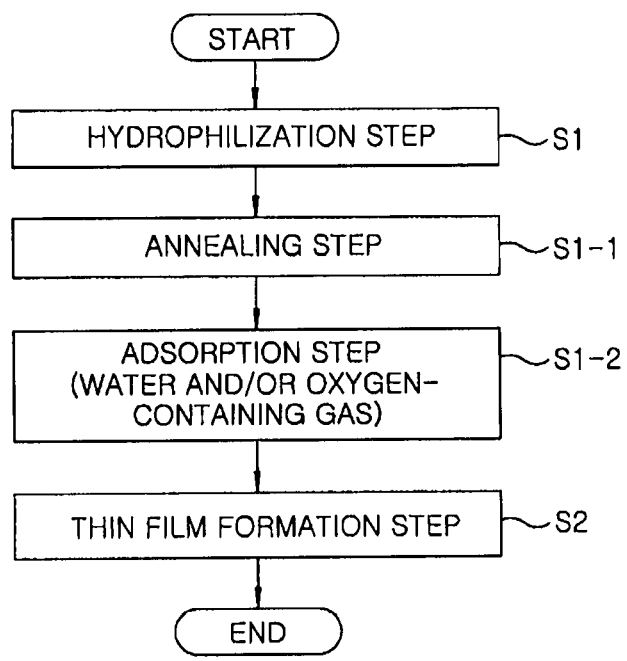
FIG. 7 is a flowchart showing a third test example of the film forming method of the present invention.
Figure 8A:
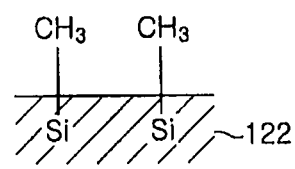
FIGS. 8A and 8B show an example of changes on a surface of an insulating layer in the case of performing a hydrophilization process on the surface of the insulating layer.
Figure 8B:
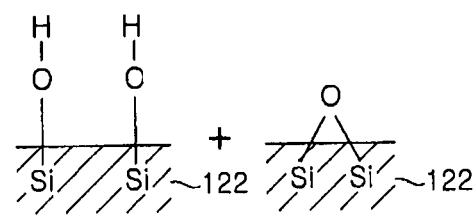

Hereinafter, embodiments of a film forming method, a pretreatment device and a processing system of the present invention will be described in detail with reference to the accompanying drawings. FIG. 1 is a schematic configuration view showing an example of a processing system for performing a method of the present invention. FIG. 2 is a schematic cross sectional view showing a pretreatment device capable of performing three processes including a hydrophilic process, an annealing process and an adsorption process. FIG. 3 is a schematic cross sectional view showing a film forming apparatus for forming manganese oxide. FIGS. 4A to 4D are overall explanatory views for explaining the film forming method of the present invention. FIG. 5 is a flowchart showing a first test example of the film forming method of the present invention. FIG. 6 is a flowchart showing a second test example of the film forming method of the present invention. FIG. 7 is a flowchart showing a third test example of the film forming method of the present invention. FIGS. 8A and 8B show an example of changes on a surface of an insulating layer in the case of performing a hydrophilization process on the surface of the insulating layer.

As shown in FIG. 1, a processing system 10 in accordance with an embodiment of the present invention includes a common transfer chamber 14 in which a transfer mechanism 12 for transferring a semiconductor wafer W as a target object is provided. The common transfer chamber 14 has an inner space that can be evacuated to vacuum and is maintained in a depressurized atmosphere during a normal operation. The transfer mechanism 12 has two picks 12A and 12B for holding the wafer W, and is configured to be rotatable, extensible and contractible so as to load and unload the wafer W into and from various processing apparatuses or load-lock chambers, as will be described later.

In the illustrated example, the common transfer chamber 14 is formed in a hexagonal shape and connected to load-lock chambers 16 and 18 through openable and closeable gate valves G provided at two adjacent sides of the hexagon. The load-lock chambers 16 and 18 can be switched between a vacuum state and an atmospheric pressure state which are alternately repeated during loading and unloading of the wafer W, and the loading and unloading of the wafer W can be performed while maintaining a vacuum state in the common transfer chamber 14. Further, a supporting table 20 for temporarily supporting the wafer W is provided in each of the load-lock chambers 16 and 18.

A loader chamber 22 formed in a horizontally long box shape is connected to the opposite sides of the load-lock chambers 16 and 18 via gate valves G. A plurality of cassette tables 24 is attached to a longitudinally extending side of the loader chamber 22, and cassettes 26 capable of accommodating therein a plurality of wafers W can be mounted thereon. Further, openable and closeable gate doors 27 are provided at a sidewall of the loader chamber 22 to which the cassettes 26 are attached. By opening the gate doors 27, the wafers W can be loaded and unloaded between the cassettes 26 and the loader chamber 22.

A transfer arm 28 capable of moving along a longitudinal direction of the loader chamber 22 is provided in the loader chamber 22. The transfer arm 28 has two rotatable and extensible/contractible picks 28A and 28B, and can transfer wafers W held by the picks 28A and 28B. An orienter 30 for aligning an orientation and a direction of the wafer W is provided at one longitudinal end of the loader chamber 22.

Hereinafter, a flow of the wafer W will be described. First, a cassette 26 accommodating unprocessed wafers W is mounted on any one of the cassette tables 24 attached to the loader chamber 22. Then, the wafers W in the cassette 26 are transferred to the loader chamber 22 in an atmospheric atmosphere by the transfer arm 28. Next, the wafers W are transferred to the orienter 30 by the transfer arm 28. The positions and the orientation of the wafers W are aligned by using notches or orientation flats formed at the wafers W. The wafers W are transferred to any one of the load-lock chamber, e.g., the load-lock chamber 16, by the transfer arm 28.

After the inside of the load-lock chamber 16 is switched from an atmospheric pressure to a vacuum atmosphere, the wafers W accommodated in the load-lock chamber 16 are loaded into the common transfer chamber 14 by the transfer mechanism 12 provided in the common transfer chamber 14. Then, the unprocessed wafers W are loaded into processing apparatuses to be described later by the transfer mechanism and subjected to predetermined processes in the respective processing apparatuses. Next, the processed wafers W are unloaded to the loader chamber 22 through one of the load-lock chambers, e.g., the load-lock chamber 18, and then are accommodated in a predetermined cassette 26 accommodating processed wafers W.

Hereinafter, each of the processing apparatuses connected to the common transfer chamber 14 will be described. In FIG. 1, a plurality of, i.e., four in this example, processing apparatuses is connected to the hexagonal common transfer chamber 14 via gate valves G, thereby forming a so-called cluster tool type structure. The four processing apparatuses include a hydrophilization apparatus 32 for performing a hydrophilization process on the wafer W, an annealing apparatus 34 for performing an annealing process on the wafer W, an adsorption apparatus 36 for adsorbing moisture or the like on the wafer W, and a film forming apparatus 38 for forming a thin film containing Mn, e.g., a MnOx film, on the wafer W.

Here, the processing apparatuses required to perform the method of the present invention are the hydrophilization apparatus 32 and the film forming apparatus 38. The other processing apparatuses, i.e., the annealing apparatus 34 and the adsorption apparatus 36 may be provided if necessary. The hydrophilization apparatus 32 performs a hydrophilization process on the surface of the insulating layer formed on the surface of the wafer W to make the surface hydrophilic. The hydrophilization process includes the following four processes, and any one of the processes may be carried out.

In a first hydrophilization process, a plasma process is performed on the insulating layer of the wafer W by using an oxygen-containing gas and/or a rare gas. In that case, a plasma processing apparatus is used as the hydrophilization apparatus 32. FIG. 1 shows the case of using the plasma processing apparatus. In a second hydrophilization process, a surface modification process for modifying a surface is performed on the insulating layer of the wafer by using UV rays and oxygen-containing gas. In that case, a UV ray irradiation processing apparatus is used as the hydrophilization apparatus 32.

In a third hydrophilization process, a GCIB (Gas Cluster Ion Beam) process for irradiating a gas cluster ion beam on the surface of the insulating layer of the wafer W is performed. In that case, a gas cluster ion beam irradiation processing apparatus is used as the hydrophilization apparatus 32. In a fourth hydrophilization process, a visible ray irradiation process for irradiating visible rays having a wavelength of about 425 nm on the surface of the insulating layer of the wafer W is performed. In that case, a visible ray irradiation processing apparatus is used as the hydrophilization apparatus 32. The visible rays (violet) having a wavelength of about 425 nm correspond to binding energy between silicon and a methyl group (Si—CH$_3$), and the wavelength thereof can effectively cut the methyl groups. As described above, any one of the processing apparatuses is used as the hydrophilization apparatus 32.

In the annealing apparatus 34, the wafer W is heated to a predetermined temperature to evaporate moisture in the insulating layer formed on the wafer W. In that case, the processing temperature is set to be higher than the processing temperature in the film forming apparatus 38. In this annealing process, it is preferable to supply a nonreactive gas, e.g., N$_2$, Ar, He or the like, into the processing apparatus. In the adsorption apparatus 36, water (steam) and/or oxygen-containing gas is adsorbed on the surface of the insulating layer of the wafer W to facilitate the deposition of a thin film thereon.

<Pretreatment Device>

The three processing apparatuses, i.e., the hydrophilization apparatus 32, the annealing apparatus 34 and the adsorption apparatus 36, may be configured as a single pretreatment device. FIG. 2 is a cross sectional view showing such pretreatment device. As illustrated, a pretreatment device 42 has a cylindrical processing chamber 44 made of aluminum alloy or the like, and the processing chamber 44 is grounded. A loading/unloading port 46 is provided at a sidewall of the processing chamber 44. The loading/unloading port 46 is connected to the common transfer chamber 14 via a gate valve G so that the wafer W can be loaded into and unloaded from the common transfer chamber 14.

A gas exhaust port 48 is formed at the bottom portion of the processing chamber 44, and a gas exhaust unit 50 is connected to the gas exhaust port 48. The gas exhaust unit 50 has a gas exhaust passage 51 connected to the gas exhaust port 48. A pressure control valve 52 such as a butterfly valve or the like and a vacuum pump 54 are sequentially installed in the gas exhaust passage 51, so that the inner space of the processing chamber 44 can be exhausted to vacuum while controlling a pressure of an atmosphere in the processing chamber 44. Besides, a gas introduction unit, e.g., a shower head 56, is provided at a ceiling portion of the processing chamber 44, and a required gas is introduced into the processing chamber 44 through gas holes 56A formed in a gas injection surface. A gas supply unit 58 for supplying a required gas is connected to the shower head 56.

The gas supply unit 58 has a gas passage 60 connected to a gas inlet 56B of the shower head 56. An upstream side of the gas passage 60 is branched into a plurality of branch lines 62. A flow rate controller 64 such as a mass flow controller or the like and an opening/closing valve 66 are installed in each of the branch lines 62, so that a required gas can be supplied at a controller flow rate. Here, Ar serving as a rare gas, oxygen, ozone or gaseous mixture thereof serving as an oxygen-containing gas, N$_2$ serving as a nonreactive gas, and moisture (steam, H$_2$O) may be supplied if necessary. Further, moisture may be supplied by bubbling using a nonreactive gas.

A mounting table structure 68 for mounting thereon a wafer W is provided in the processing chamber 44. The mounting table structure 68 includes a column 70 standing on a chamber bottom portion, and a circular plate-shaped mounting table 72 made of, e.g., ceramic, and provided at an upper end portion of the column 70. Further, a heating unit, e.g., a resistance heater 74, is provided in the mounting table 72, so that the wafer W mounted on the mounting table 72 can be heated to a desired temperature. A heater power supply 78 is connected to the resistance hater 74 via a power feed line 76 and, thus, required power can be supplied.

The pretreatment device 42 includes a hydrophilization unit 80 for hydrophilizing the surface of the insulating layer of the wafer W. Here, a plasma generation unit 82 for generating a plasma in the processing chamber 44 is used as the hydrophilization unit 80. The plasma generation unit 82 has a lower electrode 84 embedded in an upper portion of the mounting table 72, and a power feed line 86 is connected to the lower electrode 84. The power feed line 86 is connected to a high frequency power supply 90 through a matching circuit 88. A plasma can be generated in a processing space 92 by applying a high frequency power to a space between the lower electrode 84 and the shower head 56 serving as an upper electrode facing the lower electrode 84. The frequency of the high frequency power may be, e.g., 13.56 MHz, but is not limited thereto.

An apparatus control unit 94 including, e.g., a computer or the like, is provided to control the entire operation of the pretreatment device 42. The apparatus control unit 94 has a storage medium 96 storing a computer-readable program required for the operation. The storage medium 96 may be a flexible disc, a CD (Compact Disc), a hard disc, a flash memory, a DVD or the like.

Thus, the pretreatment device 42 can consecutively perform the hydrophilization process, the annealing process, and the adsorption process. The pretreatment device 42 can perform only the hydrophilization process or perform the hydrophilization process and any one of the annealing process and the adsorption process. In this example, a parallel plate type (capacitively coupled) plasma generating unit is used as the plasma generating unit 82. However, it is also possible to use an inductively coupled plasma generating unit, a helicon wave excited plasma generating unit, a microwave excited surface wave plasma generating unit (including RLSA (Radial Line Slot Antenna) microwave plasma or SPA (Slot Plane Antenna) plasma), an electron cyclone resonance plasma generating unit, a remote plasma generating unit or the like.

<Film Forming Apparatus>

Hereinafter, a schematic configuration of the film forming apparatus 38 will be described with reference to FIG. 3. As described above, the film forming apparatus 38 forms a thin film containing Mn on a surface of an insulating layer of a wafer W by using a Mn-containing material gas (hereinafter, referred to as a "Mn material gas"). As for this film forming apparatus 38, a film forming apparatus disclosed in, e.g., Japanese Patent Application Publication No. 2009-016782, may be used.

As shown in FIG. 3, the film forming apparatus 38 includes a vacuum-evacuable processing chamber 100, and a loading/unloading port 102 is provided at a sidewall of the processing chamber 100. The loading/unloading port 102 is connected to the common transfer chamber 14 via a gate valve G. A mounting table 104 standing on the bottom portion of the chamber is provided in the processing chamber 100, and a resistance heater 106 serving as a heating unit is embedded in the mounting table 104. Therefore, the wafer W mounted on the top surface of the mounting table 104 can be heated to a predetermined temperature.

A shower head 108 serving as a gas introduction unit is provided at a ceiling portion of the processing chamber 100. A gas diffusion space 110 is formed in the shower head 108, and gas injection holes 114 are formed such that the gas diffusion space 110 and the processing space 112 communicate with each other. A Mn material gas is supplied to the gas diffusion space at a controlled flow rate. In that case, the Mn material gas is supplied together with a carrier gas such as $H_2$, $N_2$, a rare gas, or the like. Here, $H_2$ gas is used as a carrier gas.

As for the Mn material gas, a manganese-containing organic material, e.g. $(EtCp)_2Mn[=Mn(C_2H_5C_5H_4)_2]$, can be used. The Mn material gas is supplied to the processing space 112 from the gas injection holes 114 and reaches the surface of the wafer W. Then, the Mn material gas is decomposed, so that a MnOx film as a thin film containing a first metal is formed on the surface of the insulating layer of the wafer W by thermal CVD reaction. In that case, manganese obtained by decomposition on the surface of the wafer W is coupled with oxygen in the insulating layer, thereby forming the MnOx film. The film forming apparatus 38 is only an example, and the MnOx film can be formed by another film forming method, e.g., a PVD method.

Referring back to FIG. 1, a system control unit 116 formed of, e.g., a computer or the like, is provided control the entire operation of the processing system 10 configured as described above. The system control unit 116 has a storage medium 120 for storing a computer readable program required for the operation. The storage medium 120 may be a flexible disc, a CD (Compact Disc), a hard disc, a flash memory, a DVD or the like. The operations of the processing apparatuses 32 to 38 are performed under the control of the system control unit 116. Accordingly, each of the following processes is carried out.

<Description of the Method of the Present Invention>

Hereinafter, the method of the present invention which is performed by using the processing system 10 configured as described above will be explained. FIGS. 4A to 4D are overall explanatory views for explaining the film forming method of the present invention. FIG. 5 is a flowchart showing a first test example of the film forming method of the present invention. FIG. 6 is a flowchart showing a second test example of the film forming method of the present invention. FIG. 7 is a flowchart showing a third test example of the film forming method of the present invention. FIGS. 8A and 8B show an example of changes on a surface of an insulating layer in the case of performing a hydrophilization process on the surface of the insulating layer.

Figure 4:
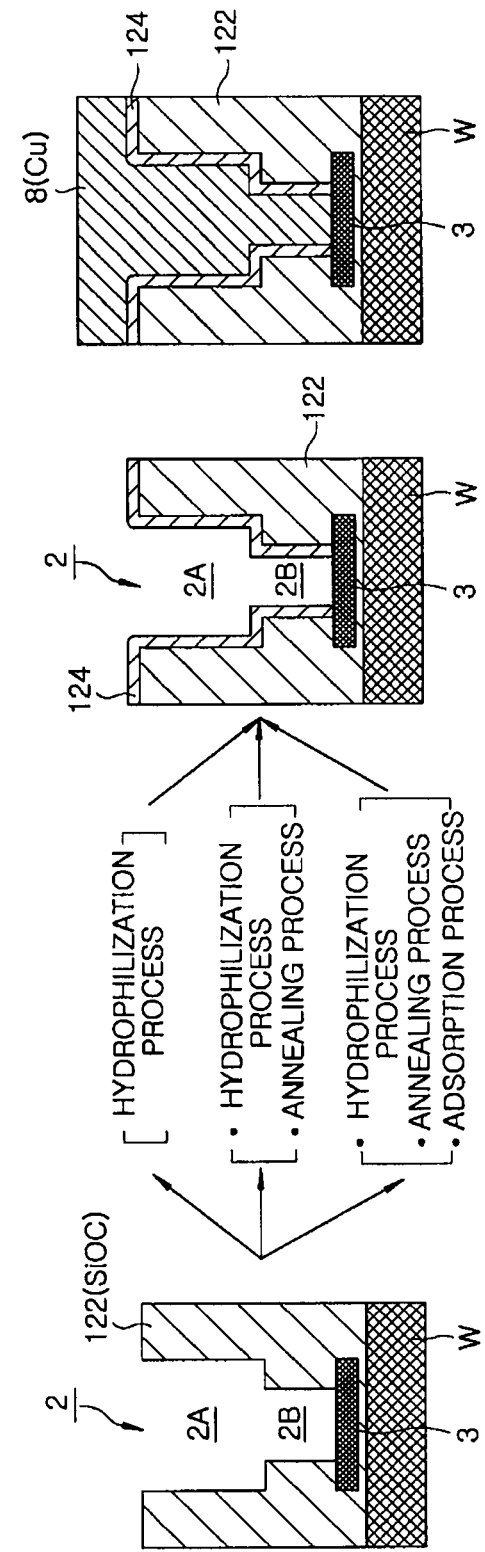
FIGS. 4A to 4D are overall explanatory views for explaining the film forming method of the present invention.
Figure 13A:
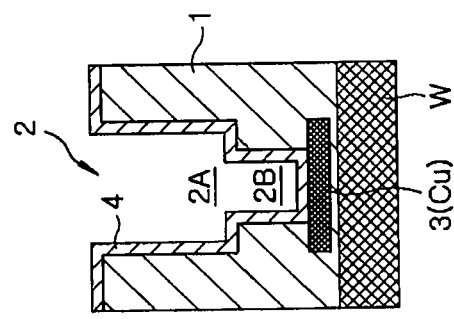
FIGS. 13A to 13C show a conventional process for filling a recess of a semiconductor wafer.
Figure 13B:
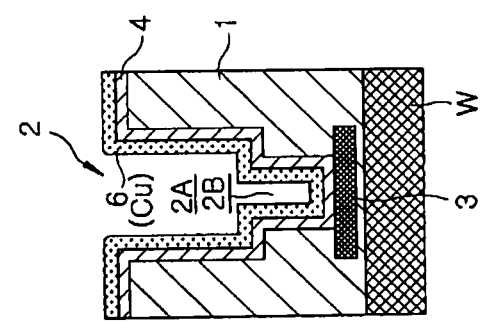
Figure 13C:
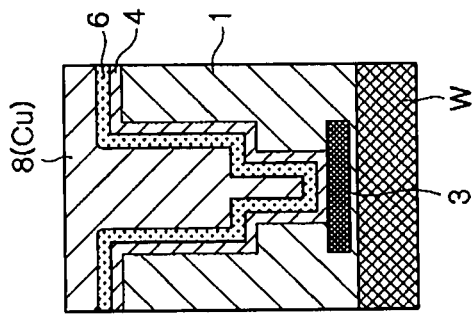

First, an unprocessed semiconductor wafer W of the present invention has a state shown in FIG. 4A. The structure thereof is the same as that shown in FIG. 13A (except the barrier layer 4) except that an insulating layer 122 having a low relative dielectric constant is used instead of a $SiO_2$ film made of TEOS. In other words, a recess 2, e.g., a via hole, a through hole or a groove (trench), which has a single damascene structure, a dual damascene structure or a three-dimensional mounting structure is formed on the surface of the insulating layer (interlayer insulating film) 122 formed on the semiconductor wafer W. The insulating layer is made of a material having a low relative dielectric constant which is referred to as, e.g., a low-k film (SiCO). At the bottom portion of the recess 2, the underlying wiring layer 3 made of, e.g., copper, is formed to be exposed. Here, the Low-k material denotes a material having a relative dielectric constant lower than 4.1 which is a relative dielectric constant of a $SiO_2$ film.

Specifically, the recess 2 has a thin and long groove (trench) 2A having a recess shaped cross section, and a hole 2B formed at a part of the bottom portion of the groove 2A and serving as a contact hole or a through hole. Further, the wiring layer 3 is exposed on the bottom portion of the hole 2B to make electric connection to an underlying wiring layer or a device such as a transistor or the like. The illustration of the underlying wiring layer or the device such as a transistor or the like is omitted. Due to the miniaturization of design rules, the recess 2 has a very small width or inner diameter of, e.g., about 120 nm, and an aspect ratio of, e.g., about 2 to 4. The illustration of a diffusion barrier film, an etching stop film or the like is simplified or omitted.

The pretreatment shown in FIG. 4B is performed on the wafer W having a state shown in FIG. 4A to make the surface of the insulating layer 122 hydrophilic (S1). Next, as shown in FIG. 4C, a thin film forming process for forming a thin film 124 containing a first metal on the surface of the insulating layer 122 and the expose surface in the recess 2 is performed (S2). Since the surface of the insulating layer 122 is hydrophilic, the thin film 124 is effectively deposited thereon. As described above, the thin film 124 is composed of a MnOx film, and the MnOx film serves as a barrier layer.

A seeding film made of copper is formed on the surface of the thin film 124 (including the exposed surface in the recess 2) by sputtering or the like, and a copper plating process is performed thereon. Accordingly, the recess 2 is filled with a metal film 8 formed of, e.g., a copper film (see FIG. 4D). Thereafter, the excessive metal film 8, the seeding film and the barrier layer 124 on the wafer surface are removed by a polishing process such as the aforementioned CMP process or the like.

Hereinafter, the pretreatment depicted in FIG. 4B will be described in detail. The pretreatment includes a first test example shown in FIG. 5, a second test example shown in FIG. 6 and a third test example shown in FIG. 7, and any one of the test examples may be implemented.

<First Test Example>

First, in the first test example shown in FIG. 5, the hydrophilization step S1 for hydrophilizing the surface of the insulating layer 122 is performed and, then, the thin film formation step S2 for forming the thin film 124, i.e., a MnOx film in this example, is performed. As described above, the hydrophilization process includes the plasma process, the UV ray ozone process, the GCIB process and the visible ray irradiation process, and any one of the processes may be selected and performed.

(Plasma Process)

Here, the case of performing the plasma process as the hydrophilization process will be described. The plasma process can be performed by the hydrophilization apparatus 32 shown in FIG. 1 (or by the pretreatment device 42 shown in FIG. 2). In this plasma process, a plasma is generated in an atmosphere of a rare gas such as Ar or the like, an atmosphere of a oxygen-containing gas such as $O_2$ or the like, or an atmosphere of gaseous mixture thereof, thereby making the surface of the insulating layer 122 hydrophilic. The low-k film (SiOC) forming the insulating layer 122 is generally made from an organic material such as trimethylsilane or the like. Therefore, the surface thereof is terminated with a methyl group ($-CH_3$) as shown in FIG. 8A and becomes hydrophobic. By performing the hydrophilization process by exposing the surface of the insulating layer 122 to a plasma, the methyl groups are cut and $-OH$ group bonds or Si—O—Si bonds are formed, as shown in FIG. 8B. As a result, the surface becomes hydrophilic. When the surface of the insulating layer 122 becomes hydrophilic, the deposition of a MnOx film can be effectively performed in the thin film formation step as the post step.

The effect of the plasma process can be achieved by performing the plasma process at least for a few seconds, as will be described later. Although the processing pressure or the high frequency power of the plasma process are not particularly limited, the processing pressure is practically in the range of about $10^0$ to $10^5$ Pa and the high frequency power is practically in the range of about $10^1$ to $10^4$ watt. As described above, the plasma process can be performed by the pretreatment device shown in FIG. 2. When the plasma process is performed by using $O_2$ gas, the formation of —OH group on the surface of the insulating layer is facilitated. Accordingly, the deposition of a MnOx film can be more effectively performed. Depending on a molecule structure or a constituent element of the low-k insulating layer 122, it is also possible to use a plasma of a processing gas containing H, a plasma of a processing gas containing C, a plasma of a processing gas containing N, or a plasma of a processing gas containing halogen such as F or the like.

(UV Ray Ozone Process)

In a surface modification process as a second example of the hydrophilization process, a UV ray ozone process is performed by using a known UV ray ozone processing apparatus as the hydrophilization apparatus 32 shown in FIG. 1. In this UV ray ozone process, a wafer W is exposed to an atmosphere of an oxygen-containing gas such as ozone or $O_2$ gas and, at the same time, UV rays are irradiated thereon. Accordingly, the surface of the insulating layer 122 is modified to a hydrophilic surface. The UV rays are irradiated by a low pressure mercury lamp (wavelength: about 185 nm to 254 nm), a Xe excimer lamp (wavelength: about 172 nm) or the like. Preferably, UV rays having a short wavelength (wavelength: about 240 nm or less) are used.

Due to the irradiation of UV rays, at least a part of $O_2$ gas is turned into ozone or oxygen radicals, and the hydrophobic surface of the insulating layer 122 is modified to the hydrophilic surface. When the surface of the insulating layer 122 becomes hydrophilic, the deposition of a MnOx film can be effectively performed in the thin film formation step as the post step. Depending on types of the low-k film, the surface of the insulating layer 122 may be hydrophilized by performing a process using a very small amount of diluted ozone without irradiating UV rays.

(GCIB Process)

In a GCIB process as a third example of the hydrophilization process, a gas cluster ion beam process is performed by using a known GCIB processing apparatus as the hydrophilization apparatus 32 shown in FIG. 1. In this GCIB process, clusters of a few or thousands of loosely bonded atoms or molecules are ionized with positive charges, and then are irradiated on the surface of the insulating layer 122 while being accelerated by an accelerating voltage of about 2.5 kV to 80 kV. The gas used at this time is $O_2$, $N_2$, $H_2$, $CH_4$, a rare gas, e.g., Ar, He or the like, or gaseous mixture thereof may also be used. As described above, by irradiating a gas cluster ion beam on the surface of the insulating layer 122, the hydrophobic surface is modified to the hydrophilic surface. When the surface of the insulating layer 122 becomes hydrophilic, the deposition of a MnOx film can be effectively performed in the thin film formation step as the post step.

(Visible Ray Irradiation Process)

In a visible ray irradiation process as a fourth example of the hydrophilization process, visible rays having a wavelength of about 425 nm are irradiated by using a visible ray irradiation processing apparatus as the hydrophilization apparatus 32 shown in FIG. 1. In this visible ray irradiation processing apparatus, visible rays having a wavelength of about 425 nm (violet) are irradiated on the surface of the insulating layer 122, as described above. Here, the binding energy of silicon and a methyl group (Si—$CH_3$) terminated on the surface of the insulating layer 122 corresponds to the energy of visible rays having a wavelength of about 425 nm as described above. Hence, the methyl groups are effectively cut, and —OH group bonds or Si—O—Si bonds (see FIGS. 8A and 8B) are formed, which makes a hydrophobic surface hydrophilic. When the surface of the insulating layer 122 becomes hydrophilic, the deposition of a MnOx film can be effectively performed in the thin film formation step as the post step.

Upon completion of the hydrophilization step S1, the thin film formation step S2 is performed by the film forming apparatus 38. In the case of implementing the first test example, the annealing apparatus 34 and the adsorption apparatus 36 shown in FIG. 1 may not be provided. The thin film formation step is executed by using the film forming apparatus 38 shown in FIG. 3. In other words, the wafer W mounted on the mounting table 104 is heated to a predetermined temperature by the resistance heater 106. The processing chamber 100 is exhausted to vacuum, and a Mn material gas is supplied into the processing chamber 100 from the shower head 108 together with $H_2$ gas as a carrier gas. Accordingly, the decomposition reaction occurs on the wafer surface, and a MnOx film (see FIG. 4C) as the thin film 124 containing a first metal is formed on the surface of the insulating layer 122 formed on the surface of the wafer W. As described above, the Mn material gas is supplied by using $H_2$ gas as a carrier gas.

In that case, the Mn material gas is decomposed by contact with oxygen during heating, and manganese tends to be strongly coupled with oxygen. Therefore, manganese reacts with oxygen in the insulating layer 122 containing an oxygen component, thereby forming a MnOx film. Hence, the MnOx film is hardly deposited on the copper exposed surface at the bottom portion in the recess 2 where the wiring layer 3 is exposed. Since the surface of the insulating layer 122 is hydrophilic, the thin film 124 composed of the MnOx film can be rapidly, easily and effectively deposited on the exposed surface in the recess 2 as well as on the surface of the insulating layer 122.

The processing conditions at this time are set as follows: a processing temperature is about 100° C. to 400° C., e.g., about 200° C.; a processing temperature is about $10°$ Pa to $10^5$ Pa, e.g., 133 Pa; a flow rate of the Mn material gas is about 0.2 sccm to 10 sccm; and a flow rate of the carrier gas is about 10 sccm to 100 sccm. At this time, a MnOx film having a thickness of about 1 nm to 7 nm is formed. When the thin film formation step (S2) is completed, a Cu seeding film is formed by sputtering, and the recess is filled with copper by a plating process, as described above (see FIG. 4D).

<Second Test Example>

Hereinafter, a second test example of the present invention will be described. In the second test example, as shown in FIG. 4B, an annealing process is performed in addition to the hydrophilization process of the first test example. Specifically, as shown in FIG. 6, an annealing step S1-1 for performing annealing by heating the wafer W to a predetermined temperature is performed between the aforementioned hydrophilization step S1 and thin film formation step S2. In this annealing process, the wafer W is heated to a temperature higher than the processing temperature in the thin film formation step so that moisture in the insulating layer 122 can be removed.

The annealing process can be performed by the annealing apparatus 34 shown in FIG. 1. During the annealing process, a nonreactive gas such as $N_2$ gas, or a rare gas such as Ar or He is supplied to remove moisture contained in the insulating layer 122. The annealing process is performed for the following reasons. In other words, the Mn material gas used in the thin film formation step S2 as the post step of the annealing step tends to easily react with moisture. Thus, if moisture is generated from the insulating layer 122 in the thin film formation step, the film thickness of the MnOx film is varied depending on the amount of the generated moisture, which leads to deterioration of the reproducibility of the film forming process.

Therefore, the moisture in the insulating layer 122 is preliminarily removed by performing the annealing process on the wafer W before the thin film formation step S2. As a consequence, the reproducibility of the film thickness in the thin film formation step as the post step is improved. In that case, the processing temperature in the annealing process is preferably set to be higher than the processing temperature in the thin film formation step, as described above. Accordingly, it is possible to reliably prevent the generation of moisture in the insulating layer 122 in the thin film formation step. For example, when the processing temperature in the thin film formation step is set to, e.g., about 200° C., the processing temperature in the annealing step is preferably set to a temperature higher than the above temperature, e.g., about 220° C. The annealing step S1-1 may be performed immediately before the hydrophilization step S1, instead of between the steps S1 and S2. The annealing process may also be performed by the pretreatment device shown in FIG. 2.

<Third Test Example>

Hereinafter, a third test example of the method of the present invention will be described. In the third test example, as shown in FIG. 4B, an adsorption process for adsorbing water (steam) and/or oxygen-containing gas on the surface of the insulating layer 122 is performed in addition to the processes of the first and the second test example. Specifically, as shown in FIG. 7, an adsorption step S1-2 for performing an adsorption process is executed between the annealing step of S1-1 of the second test example and the thin film formation step S2.

The adsorption process can be performed by the adsorption apparatus 36 shown in FIG. 1. By adsorbing steam or $O_2$ gas on the surface of the insulating layer 122 by exposing the wafer W to an atmosphere of water (steam) or oxygen-containing gas, e.g., $O_2$ gas, —OH group bonds or Si—O—Si bonds are formed. Therefore, the deposition amount of the MnOx film in the post step is increased by the enhanced hydrophilic property. The adsorption process may be performed, without using the adsorption apparatus 36, by exposing the wafer W to an atmosphere having a certain humidity.

The adsorption step S1-2 may be executed immediately before the annealing step S1-1 or immediately before the hydrophilization process S1. Moreover, the sequence of the hydrophilization step S1 and the annealing step S1-1 in the flowchart shown in FIG. 7 may be reversed. The adsorption process can be performed by the pretreatment device 42 shown in FIG. 2. Thus, when the pretreatment device 42 shown in FIG. 2 is provided, the hydrophilization process (plasma process), the annealing process and the adsorption process can be consecutively performed in the pretreatment device 42. When the number of processes needs to be reduced, any one of the annealing process and the adsorption process can be performed in addition to the hydrophilization process (plasma process).

<Evaluation of the Method of the Present Invention>

Hereinafter, the evaluation result of the method of the present invention which forms a MnOx film on a surface of an insulating layer will be described.

(Ar Plasma Process)

Figures 9, 10A, 10B:
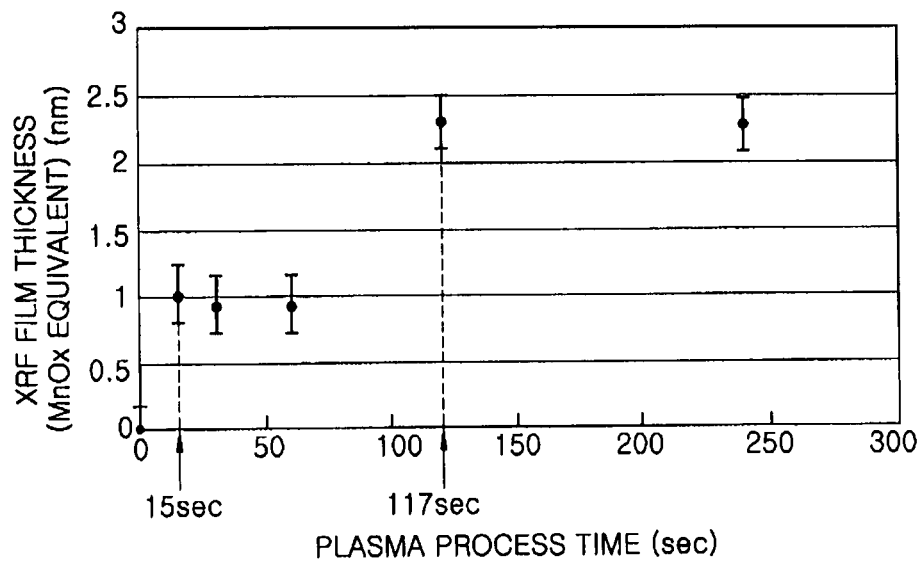
FIG. 9 is a graph showing relationship between plasma processing time and a XRF film thickness (MnOx equivalent).
FIGS. 10A and 10B show a wettability state of a surface of a Low-k film (SiOC).

First, an Insulating Film Composed of a Sioc Film containing a single methyl group or the like, which is one of a low-k material (having a relative dielectric constant smaller than about 4.1) is formed on the surface of the wafer W. Then, the plasma process is performed as the hydrophilization process on the wafer having the insulating layer. Next, the deposition amount of the MnOx film in the case of performing the MnOx film forming process is evaluated. The evaluation result will be described. FIG. 9 is a graph showing relationship between plasma process time and a XRF film thickness (MnOx equivalent). The XRF is a fluorescent X-ray analysis apparatus. Here, an Ar plasma process was performed as the plasma process. The time required for forming the MnOx film was about 600 sec.

As shown in FIG. 9, when the plasma process was not performed (processing time=0 sec), the MnOx film was hardly deposited. When the plasma process was performed for, e.g., about 15 sec, the film thickness of the deposited MnOx film was about 1 nm, which was good. When the plasma process was performed for about 117 sec or more, the film thickness of the deposited MnOx film was about 2.3 nm or more, which was excellent.

(Wettability)

Then, the wettability of the surface of the insulating layer composed of a SiOC film and the effect of the $O_2$ plasma process on the wettability were evaluated. For comparison, the wettability of the insulating layer composed of a $SiO_2$ film that was made from TEOS was evaluated. FIGS. 10A and 10B show the state of the wettability of the surface of the SiOC film. FIG. 10A shows the result of the wettability of the TEOS film ($SiO_2$ film) and the SiOC film.

FIG. 10B shows dependency of the wettability on the processing time of the $O_2$ plasma process.

Here, $H_2O$ (moisture) and $C_2H_5OH$ (ethyl alcohol) were evaluated. As clearly can be seen from FIG. 10A, the $SiO_2$ film made from TEOS has wettability to $H_2O$ and ethyl alcohol, whereas the SiOC film has wettability with ethyl alcohol but has no wettability or poor wettability to $H_2O$. The wettability difference is considered to be caused by the fact that Si—O—Si bonding or Si—OH bonding exists on the surface of the $SiO_2$ film of TEOS, whereas Si—$CH_3$ bonding exists on the surface of the SiOC film.

As can be seen from FIG. 10B, when the $O_2$ plasma process was performed on the SiOC film while varying the processing time from about 0 sec to 30 sec, the wettability to $H_2O$ was improved by performing the $O_2$ plasma process only for about 5 sec.

(Evaluation of Cu Diffusion Barrier Property of MnOx Film)

Figure 11:
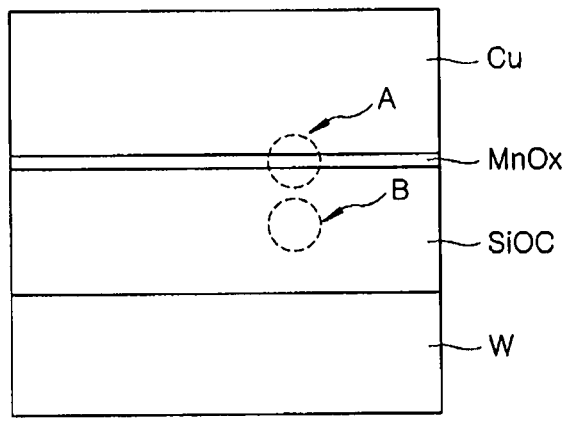
FIG. 11 is a schematic view showing a cross section having at the center thereof a MnOx film of a wafer in the case of performing an accelerated load test.
Figure 12A:
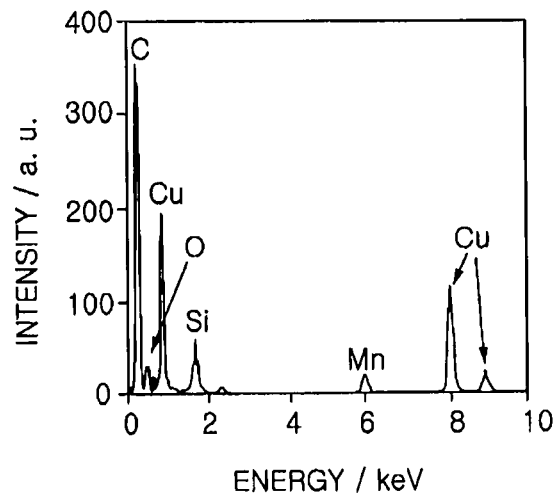
FIGS. 12A and 12B are graphs showing an analysis result of elements in a specific portion in FIG. 11.
Figure 12B:
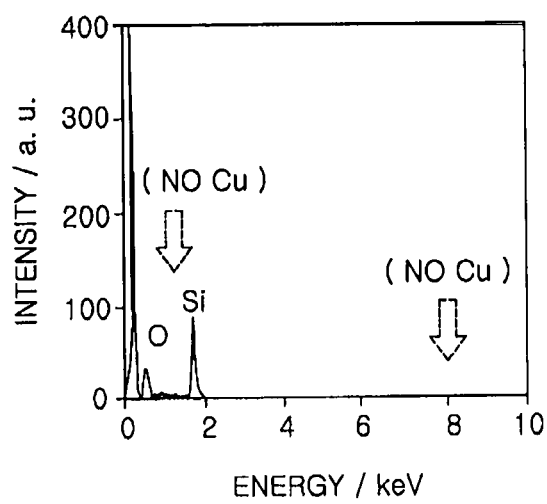

Hereinafter, the evaluation result of the Cu diffusion barrier property of the MnOx film in the case of depositing a Cu film on the MnOx film formed on the surface of the insulating film subjected to the $O_2$ plasma process as the hydrophilization process and performing the accelerated load test (annealing) will be described. FIG. 11 is a schematic view showing a cross section having at the center thereof a MnOx film of a wafer in the case of performing an accelerated load test. FIGS. 12A and 12B are graphs showing an analysis result of elements in a specific portion in FIG. 11. FIG. 12A is a graph showing distribution of elements in an A portion as a boundary portion of the MnOx film shown in FIG. 11 (immediately after the formation of the MnOx film), and FIG. 12B is a graph showing distribution of elements in a B portion in the SiOC film which is positioned slightly lower than the boundary portion of the MnOx film shown in FIG. 11 (after the accelerated load test).

Here, the $O_2$ plasma process was performed as the hydrophilization process only for about 10 sec, and the MnOx film was formed by performing the thin film forming process for about 30 min. The process conditions at this time were set as follows: a processing temperature was about 200° C.; a processing pressure was about 133 Pa; a flow rate of $H_2$ carrier gas was about 25 sccm; and a flow rate of a Mn material gas ((EtCp)$_2$Mn) was about 7 sccm. Then, a Cu film was deposited on the MnOx film by sputtering. Next, an annealing process was performed as an accelerated load test by exposing the wafer in an atmosphere at about 400° C. for about 100 hours (pressure: about $5\times10^{-5}$ Pa or less). As a result, the MnOx film having a sufficient thickness of about 3.2 nm was deposited.

As shown in FIG. 12A, Mn and Cu exist near the boundary of the MnOx film. Meanwhile, as shown in FIG. 12B, Cu does not exist in the SiOC film. From this, it is clear that Cu atoms are not diffused in spite of the accelerated load test and the MnOx film sufficiently functions as a barrier layer.

In the above-described embodiments, the SiOC film has been described as an example of the insulating layer 122 having a low relative dielectric constant. However, the insulating layer 122 is not limited thereto, and may be at least one selected from the group consisting of a SiOC film, a SiO film, a SiOF film, a SiC film, a SiCOH film, a SiCN film, a porous silica film, a porous methylsilsesquioxane film, a polyarylene film, a SiLK (Registered Trademark) film, and a fluorocarbon film.

The material gas of the organic metal material forming the MnOx film is not limited to (EtCp)$_2$Mn, and may be at least one selected from the group consisting of Cp$_2$Mn[=Mn(C$_5$H$_5$)$_2$], (MeCp)$_2$Mn[=Mn(CH$_3$C$_5$H$_4$)$_2$], (EtCp)$_2$Mn[=Mn(C$_2$H$_5$C$_5$H$_4$)$_2$], (i-PrCp)$_2$Mn[=Mn(C$_3$H$_7$C$_5$H$_4$)$_2$], MeCpMn(CO)$_3$[=(CH$_3$C$_5$H$_4$)Mn(CO)$_3$], (t-BuCp)$_2$Mn[=Mn(C$_4$H$_9$C$_5$H$_4$)$_2$]CH$_3$Mn(CO)$_5$, Mn(DPM)$_3$[=Mn(C$_{11}$H$_{19}$O$_2$)$_3$], Mn(DMPD)(EtCp)[=Mn(C$_7$H$_{11}$C$_2$H$_5$C$_5$H$_4$)], Mn(acac)$_2$[=Mn(C$_5$H$_7$O$_2$)$_2$], Mn(acac)$_2$[=Mn(C$_{11}$H$_{19}$O$_2$)$_2$], Mn(acac)$_3$[=Mn(C$_5$H$_7$O$_2$)$_3$], Mn(hfac)$_2$[=Mn(C$_5$HF$_6$O$_2$)$_3$], ((CH$_3$)$_5$Cp)$_2$Mn[=Mn((CH$_3$)$_5$C$_5$H$_4$)$_2$], [Mn(iPr-AMD)$_2$][=Mn(C$_3$H$_7$NC(CH$_3$)NC$_3$H$_7$)$_2$], and [Mn(t Bu-AMD)$_2$][=Mn(C$_4$H$_9$NC(CH$_3$)NC$_4$H$_9$)$_2$]. In the above description, the MnOx film is formed by a CVD method. However, the present invention can be applied to the case of forming a MnOx film (or a MnSixOy film) by a PVD method. For example, when a Cu film containing Mn was deposited on a hydrophilic insulating film while performing heat treatment at about 200° C., MnOx film was formed at the interface between Cu and the insulating film. Meanwhile, when a Cu film containing Mn was deposited on a hydrophobic insulating film while performing heat treatment at about 200° C., MnOx film was not formed at the interface between Cu and the insulating film. From this, it is clear that the surface of the insulating film needs to be hydrophilic in order to form the MnOx thin film at the interface by reaction between Mn atoms solid-solved/diffused in the Cu layer and O atoms in the insulating film adjacent to the Cu layer. Thus, when the surface of the insulating film is hydrophobic, it is effective to perform the hydrophilization process on the surface thereof.

In the above description, the semiconductor wafer is used as an example of the object to be processed. The semiconductor wafer may include a silicon substrate or a compound semiconductor substrate such as GaAs, SiC, GaN or the like. The present invention may also be applied to a glass substrate used for a liquid crystal display, a ceramic substrate or the like, other than the above substrates. Moreover, a semiconductor device having a film structure formed by the film forming method of the present invention and an electronic device having this semiconductor device are included in the scope of the present invention.

What is claimed is:

1. A method for forming a thin film on an object, the thin film comprising manganese and the object comprising an underlying wiring layer and an insulating layer which comprises a low-k film and a recess, the underlying wiring layer being exposed at a bottom of the recess, the method comprising:
   hydrophilizing a surface of the insulating layer to obtain a hydrophilic surface; and
   contacting the hydrophilic surface with a gas comprising manganese to obtain the thin film on the surface of the insulating layer while substantially suppressing the thin film from being formed on the exposed underlying wiring layer.

2. The method of claim 1, wherein the hydrophilizing comprises a plasma process.

3. The method of claim 2, wherein the plasma process is performed in the presence of oxygen, a noble gas, or both.

4. The method of claim 1, wherein the hydrophilizing comprises a UV ray ozone process comprising oxygen.

5. The method of claim 1, wherein the hydrophilizing comprises an irradiating gas cluster ion beam process.

6. The method of claim 1, wherein the hydrophilizing comprises a visible ray irradiation process, wherein the visible rays have a wavelength of about 425 nm.

7. The method of claim 1, further comprising annealing prior to the contacting, wherein the annealing is performed at a temperature higher than a temperature of the contacting.

8. The method of claim 1, further comprising adsorbing water, a gas comprising oxygen, or both, on the surface of the insulating layer, wherein the adsorbing is prior to the contacting.

9. The method of claim 1, wherein the low-k film has a relative dielectric constant smaller than 4.1.

10. The method of claim 1, wherein the low-k film comprises at least one film selected from the group consisting of a SiOC film, a SiO film, a SiOF film, a SiC film, a SiCOH film, a SiCN film, a porous silica film, a porous methylsilsesquioxane film, a polyarylene film, a SiLK (Registered Trademark) film, and a fluorocarbon film.

11. The method of claim 1, wherein the gas comprising manganese comprises at least one material selected from the group consisting of Cp$_2$Mn[=Mn(C$_5$H$_5$)$_2$], (MeCp)$_2$Mn[=Mn(CH$_3$C$_5$H$_4$)$_2$], (EtCp)$_2$Mn[=Mn(C$_2$H$_5$C$_5$H$_4$)$_2$], (i-PrCp)$_2$Mn[=Mn(C$_3$H$_7$C$_5$H$_4$)$_2$], MeCpMn(CO)$_3$[=(CH$_3$C$_5$H$_4$)Mn(CO)$_3$], (t-BuCp)$_2$Mn[=Mn(C$_4$H$_9$C$_5$H$_4$)$_2$], CH$_3$Mn(CO)$_5$, Mn(DPM)$_3$[=Mn(C$_{11}$H$_{19}$O$_2$)$_3$], Mn(DMPD)(EtCp)[=Mn(C$_7$H$_{11}$C$_2$H$_5$C$_5$H$_4$)], Mn(acac)$_2$[=Mn(C$_5$H$_7$O$_2$)$_2$]Mn(DPM)$_2$ [=Mn(C$_{11}$H$_{19}$O$_2$)$_2$], Mn(acac)$_3$[=Mn(C$_5$H$_7$O$_2$)$_3$], Mn(hfac)$_2$[=Mn(C$_5$HF$_6$O$_2$)$_3$], ((CH$_3$)$_5$Cp)$_2$Mn[=Mn((CH$_3$)$_5$C$_5$H$_4$)$_2$], [Mn(iPr-AMD)$_2$][=Mn(C$_3$H$_7$NC(CH$_3$)NC$_3$H$_7$)$_2$], and [Mn(t Bu-AMD)$_2$][=Mn(C$_4$H$_9$NC(CH$_3$)NC$_4$H$_9$)$_2$].

12. The method of claim 2, wherein the plasma process is performed in the presence of oxygen.

13. The method of claim 2, wherein the plasma process is performed in the presence of a noble gas.

14. The method of claim 1, wherein the gas comprising manganese is (EtCp)$_2$Mn[=Mn(C$_2$H$_5$C$_5$H$_4$)$_2$].

* * * * *